(12) United States Patent
Bisig et al.

(10) Patent No.: US 11,594,860 B2
(45) Date of Patent: Feb. 28, 2023

(54) VCSEL ARRAY LAYOUT

(71) Applicant: II-VI Delaware, Inc., Wilmington, DE (US)

(72) Inventors: André Bisig, Einsiedeln (CH); Bonifatius Wilhelmus Tilma, Erlenbach (CH); Norbert Lichtenstein, Langnau a. Albis (CH)

(73) Assignee: II-VI Delaware, Inc., Wilmington, DE (US)

( * ) Notice: Subject to any disclaimer, the term of this patent is extended or adjusted under 35 U.S.C. 154(b) by 245 days.

(21) Appl. No.: 16/194,980

(22) Filed: Nov. 19, 2018

(65) Prior Publication Data

US 2019/0173265 A1 Jun. 6, 2019

Related U.S. Application Data

(60) Provisional application No. 62/588,465, filed on Nov. 20, 2017.

(51) Int. Cl.
*H01S 5/42* (2006.01)
*H01S 5/32* (2006.01)
*H01S 5/042* (2006.01)
*H01S 5/00* (2006.01)

(52) U.S. Cl.
CPC ........ *H01S 5/3202* (2013.01); *H01S 5/04256* (2019.08); *H01S 5/423* (2013.01); *H01S 5/0042* (2013.01)

(58) Field of Classification Search
CPC ......... H01S 5/3202–3203; H01S 5/423; H01S 5/40; H01S 5/405; H01S 5/42–426; H01S 5/14–148; H01S 5/183–18397
See application file for complete search history.

(56) References Cited

U.S. PATENT DOCUMENTS

| | | | |
|---|---|---|---|
| 5,976,905 A | 11/1999 | Cockerill et al. | |
| 6,747,794 B2 | 6/2004 | Wang | |
| 6,949,473 B2 | 9/2005 | Biard et al. | |
| 6,967,986 B2 * | 11/2005 | Kowarz | G02B 26/08 359/291 |
| 7,456,079 B2 | 11/2008 | Chou et al. | |
| 8,848,757 B2 | 9/2014 | Joseph | |
| 8,969,890 B2 | 3/2015 | Balkenende et al. | |
| 9,038,883 B2 | 5/2015 | Wang et al. | |
| 9,520,696 B2 | 12/2016 | Wang et al. | |
| 10,153,614 B1 * | 12/2018 | Lin | H01S 5/18333 |
| 10,374,391 B2 * | 8/2019 | Graham | H01S 5/183 |

(Continued)

FOREIGN PATENT DOCUMENTS

DE 102008022881 A1 * 11/2009 ........... B41C 1/1075

*Primary Examiner* — Tod T Van Roy
*Assistant Examiner* — Delma R Fordé
(74) *Attorney, Agent, or Firm* — Wendy W. Koba

(57) ABSTRACT

An array layout of VCSELs is intentionally mis-aligned with respect to the xy-plane of the device structure as defined by the crystallographic axes of the semiconductor material. The mis-alignment may take the form of skewing the emitter array with respect to the xy-plane, or rotating the emitter array. In either case, the layout pattern retains the desired, row/column structure (necessary for dicing the structure into one-dimensional arrays) while reducing the probability that an extended defect along a crystallographic plane will impact a large number of individual emitters.

6 Claims, 3 Drawing Sheets

(56) References Cited

U.S. PATENT DOCUMENTS

| | | | |
|---|---|---|---|
| 2008/0212636 A1* | 9/2008 | Sato | H01S 5/18311 |
| | | | 372/50.11 |
| 2011/0037825 A1* | 2/2011 | Jikutani | B41J 2/442 |
| | | | 347/243 |
| 2011/0292467 A1* | 12/2011 | Mikajiri | G02B 26/123 |
| | | | 358/474 |
| 2014/0269796 A1* | 9/2014 | Geske | H01S 5/187 |
| | | | 372/34 |
| 2015/0311673 A1* | 10/2015 | Wang | H01S 5/18386 |
| | | | 372/27 |
| 2016/0352073 A1 | 12/2016 | Dummer et al. | |
| 2017/0250519 A1* | 8/2017 | Kuraoka | H01S 5/34333 |
| 2017/0256915 A1* | 9/2017 | Ghosh | H01S 5/18361 |
| 2017/0353012 A1* | 12/2017 | Barve | H01S 5/423 |
| 2019/0097397 A1* | 3/2019 | Yuen | H01S 5/026 |
| 2019/0148918 A1* | 5/2019 | Peters | H01S 5/18308 |
| | | | 372/50.124 |
| 2019/0173265 A1* | 6/2019 | Bisig | H01S 5/423 |
| 2020/0052466 A1* | 2/2020 | Chen | H01S 5/4043 |

\* cited by examiner xy-PLANE OF
CRYSTALLOGRAPHIC
AXES

VCSEL ARRAY LAYOUT

CROSS-REFERENCE TO RELATED APPLICATIONS

This application claims the benefit of U.S. Provisional Application No. 62/588,465, filed Nov. 20, 2017 and herein incorporated by reference.

TECHNICAL FIELD

The present invention is directed to the layout of VCSEL arrays and, more particularly, to utilizing a layout pattern that controls the statistical frequency distribution of the number of individual emitter failures for a given array.

BACKGROUND

In a conventional array of vertical cavity surface emitting lasers (VCSELs), the individual VCSEL diodes (emitters) are spatially arranged in a regular (or irregular) two-dimensional grid pattern. The functionality of each individual emitter relies on an intact epitaxially-grown layered structure of semiconductor materials. Typically, the semiconductor materials are ordered in a specific crystallographic structure and orientation, such as along an xy-plane of the device surface.

Crystallographic defects in these semiconductor materials have been found to lead to emitter power output degradation when the VCSELs incorporating, such defects are operated over an extended period of time. If the output power of an individual emitter falls below a given threshold, the emitter is defined as "failed". A VCSEL array may be defined as "failed" when a given number of individual emitters forming the array have failed. Extended defects are oriented along specific crystallographic planes that are projected as line segments across the surface of the VCSEL array. These extended defects include, but are not limited to, one-dimensional dislocations and two-dimensional slip lines (or cracks) along a crystallographic plane in the material.

The individual emitter failure probability is proportional to at least two different factors. The first factor is associated with the defect, type, frequency, and dimension (i.e., extent and cross-section) of the defect. The second factor is associated with the emitter vertical layout, the active area of the emitter diode and in particular on the two-dimensional emitter arrangement.

SUMMARY OF THE INVENTION

The present invention addresses the issue of defect-related emitter failure by controlling the layout of the individual emitters forming the array to intentionally randomize the individual number of emitters that are affected by extended crystallographic defects in the semiconductor material.

In accordance with one or more embodiments of the present invention, an array layout of VCSELs is intentionally mis-aligned with respect to the xy-plane of the device structure as defined by the crystallographic axes of the semiconductor material. Typical semiconductor materials used as substrates in the formation of VCSELs include GaAs and InP. The mis-alignment may take the form of skewing the emitter array with respect to the xy-plane, or rotating the emitter array. In either case, the layout pattern retains the desired row/column structure (necessary for perhaps later dicing the structure into one-dimensional arrays (or smaller-sized 2D arrays) while reducing the probability that an extended defect along a crystallographic plane will impact a large number of individual emitters.

One exemplary embodiment of the present invention takes the form of a VCSEL array comprising a plurality of individual VCSELs formed within an epitaxially-grown structure of semiconductor material having a predefined crystalline orientation and crystallographic axes represented as an xy-plane across the surface of the structure of semiconductor. The plurality of individual VCSELs are disposed in a two-dimensional array pattern that is not aligned, with the xy-plane mis-aligned with respect to the xy-plane), thereby reducing the statistical probability of an individual VCSEL intersecting an extended defect formed along a crystallographic plane of the semiconductor material.

Other and further embodiments and aspects of the present invention will become apparent during the course of the following discussion and by reference to the related drawings.

BRIEF DESCRIPTION OF THE DRAWINGS

Referring now to the drawings, where like numerals represent like parts in several views.

DETAILED DESCRIPTION

Figure 1:
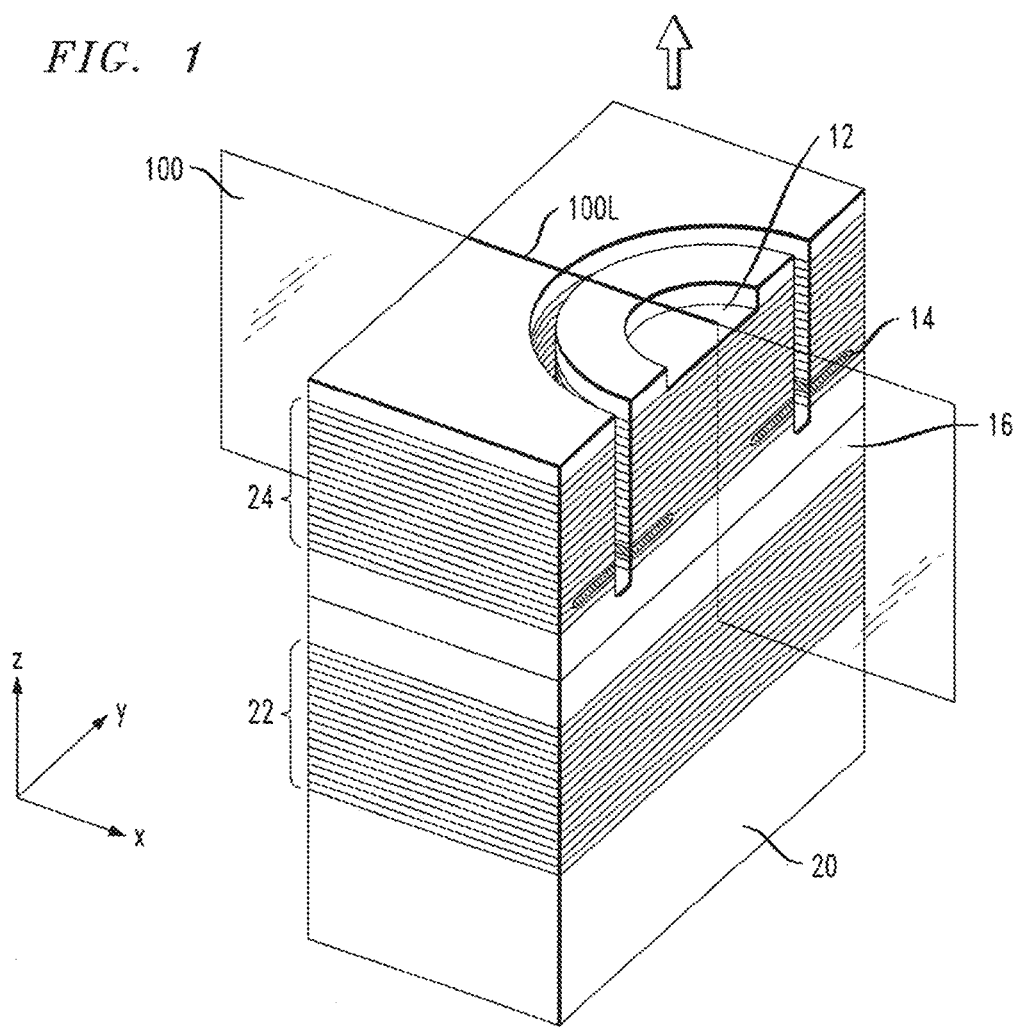
FIG. 1 is a cut-away isometric view of an exemplary VCSEL, showing the crystallographic axes and an exemplary extended defect.

FIG. 1 is a schematic cross-sectional view of a conventional oxide-isolated VCSEL 10. As indicated in FIG. 1, VCSEL 10 generally includes an emission aperture (hereinafter "emitter") 12, an oxide aperture 14, and an active region 16. The optical output from VCSEL 10 is directed upward through emitter 12, as shown. Structurally, VCSEL 10 is formed on a semiconductor substrate 20 (for example, a GaAs substrate or an InP substrate) and includes a lower distributed Bragg reflector (DBR) 22 formed on substrate 20 and an upper DBR 24 disposed above active region 16 such that active region 16 is located between DBRs 22 and 24. As is known in the art, DBRs 22 and 24 function as mirrors to define a lasing cavity in combination with active region 16 to generate the output optical emission in the vertical direction (here, the vertical direction defined as along the z-axis).

Lower DBR 22 is typically grown on substrate 20 by using an epitaxial process that follows the crystallographic orientation of substrate 20. As a result, any defects in the crystalline structure of substrate 20 may propagate through the individual layers of VCSEL 10. FIG. 1 illustrates an exemplary extended defect 100 that has formed within substrate 20 and is carried along a crystallographic plane of the device structure. When viewed from the top surface of VCSEL 10, extended defect 100 is projected as a line segment 100L along the xy-plane of the crystallographic axes. In the example of FIG. 1, line segment 100L is shown as crossing through emitter 12 of VCSEL 10. The presence of these extended defects is known to impact the emitter output power of the associated device.

Figure 2:
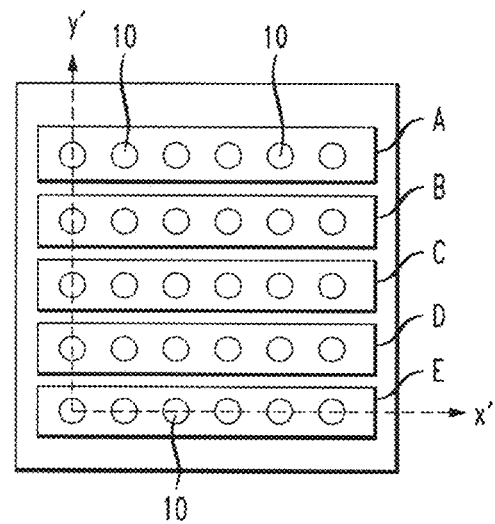
FIG. 2 is a top view of an exemplary two-dimension array of VCSELs, illustrating a conventional alignment of the VCSEL array with the xy-plane of the crystallographic axes.

As mentioned above, there are many applications that utilize arrays of VCSELs, disposed either as a one-dimensional (1D) array or a two-dimensional (2D) array. FIG. 2 is a top view of an exemplary 2D array of VCSELs 10. In this typical prior art layout, VCELs 10 are shown as disposed in a regular 2D grid pattern in alignment with the xy-plane of the crystallographic axes of the semiconductor material. In this regular pattern, a 1D array of VCSELs 10 may be defined as a "device", and each individual VCSEL is typically referred to as an "emitter" of the "device". The particular illustration of FIG. 2 shows the formation of a set of five devices A-E, each device comprising a 1D array of six emitters.

Figure 3:
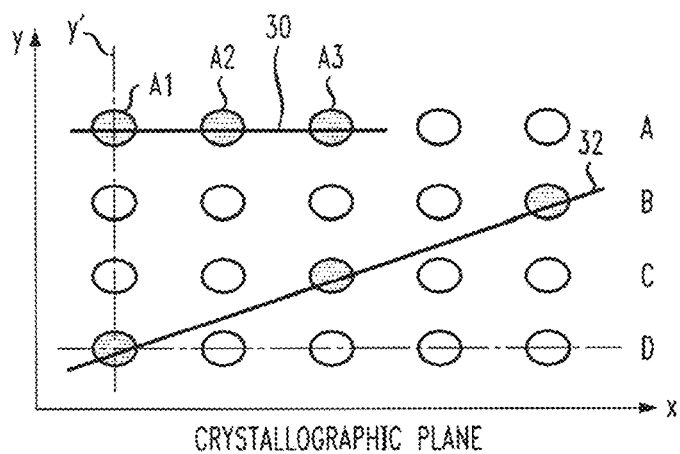
FIG. 3 is a reproduction of a portion of FIG. 2, further indicating the orientation of the xy-plane of the crystallographic axes and an illustration of two exemplary extended defects as may be formed within the semiconductor structure.

FIG. 3 illustrates a portion of the prior art emitter array of FIG. 2, and specifically illustrates the crystallographic axes of the semiconductor material used to form the array. As discussed throughout this specification, the crystallographic axes are defined as the xy-plane on the surface of the semiconductor structure. As typical of the prior art, the x'y'-axes of the emitter array (here, shown as dotted lines forming the x'-axis and the y'-axis) are aligned with the xy-plane of the VCSEL surface.

As described above, an extended defect may take the form of a defect oriented along a crystallographic plane of the semiconductor structure and extends along a particular length of that plane. Referring to FIG. 3, a first extended defect 30 and a second extended defect 32 are illustrated, where both defects are formed parallel to the xy-crystallographic plane of the VCSEL surface. When viewed from above (as is the view of FIG. 3), these extended defects take the form of line segments. In the particular configuration of FIG. 3, first extended defect 30 is shown as aligned with the x-axis of the xy-plane. As a result of this alignment, first extended defect 30 will pass through a set of adjacent emitters along the same axial direction. In the particular illustration of FIG. 3, first extended defect is shown as passing a set of three adjacent emitters A1, A2, and A3. These three emitters are shown as are part of an exemplary device A. By virtue of the presence of first extended defect 30, these three emitters are defined as "failed", and since they form a majority of the device itself, the entire device A is most likely defined as "failed" as well.

Second extended defect 32 is shown in FIG. 3 as also oriented along the xy-crystallographic plane, but in this case not aligned with either axis. As shown, second extended defect 32 extends across multiple devices (here, devices B, C, and D). The individual emitters affected by second extended defect 32 are illustrated as darkened circles in FIG. 3. From a study of the diagram of FIG. 3, it is clear that when an emitter array is formed in alignment with the xy-plane of the crystallographic axes, there is a statistically significant probability that an extended defect will pass through several individual emitters, resulting in failure of VCSEL devices formed of these elements.

The problems associated with emitter failures in the presence of extended defect structures is addressed in accordance with the principles of the present invention by modifying the layout of the emitter array pattern so as to be mis-aligned with respect to the xy-plane of the crystallographic axes of the semiconductor material. In accordance with the principles of the present invention, the array structure in terms of rows and columns is maintained, but the axes of the emitter array are mis-aligned with the axes of the xy-plane. By using a mis-aligned layout pattern, it has been found that the probability of multiple emitters being impacted by a given extended defect is significantly reduced. As will be discussed in detail below, the emitter array layout may be skewed with respect to the xy-plane, or rotated with respect to xy-plane.

Figure 4:
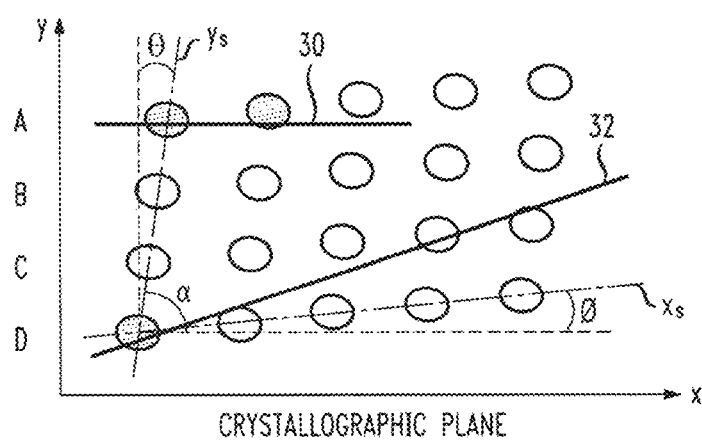
FIG. 4 illustrates an exemplary emitter array layout pattern formed in accordance with the present invention to be mis-aligned with respect to the xy-plane, where in this case the emitter array is presented in a skewed arrangement.

FIG. 4 illustrates an exemplary emitter array 50 of individual VCSELs 10 formed in accordance with the principles of the present invention to be skewed xy-plane, as defined above. In this example, the skew is shown as the pair of dotted lines defining the axes, shown as $x_s$ and $y_s$. The same number of individual emitters are laid out along these axes as shown in the prior art layout of FIG. 3, and the desired row-column array pattern of uniform spacing between adjacent emitters is maintained. In this embodiment, the emitter array axis $x_s$ is skewed at an angle of $\phi$ with respect to the x-axis of the xy-plane. Emitter array axis $y_s$ is skewed at an angle of $\theta$ with respect to the illustrated y-axis of the xy-plane.

Inasmuch as these skew angles are different in this particular embodiment (i.e., $\phi \neq \theta$), the $x_s$ and $y_s$ axes are not orthogonal to each other, but separated by an angle of $\alpha$, as shown. It is to be understood that this is only one illustration of a "skewed" array. For the purposes of the present invention, any appropriate non-zero values for $\phi$ and $\theta$ (with $\alpha \neq 90°$) will provide a skew with respect to the xy-plane of the crystallographic axes, while retaining the desired row-column pattern of uniform spacing between the individual emitters.

Also shown in FIG. 4 are first extended defect 30 and second extended defect 32, each as formed within the same regions of the crystallographic structure as shown in FIG. 3, for the sake of comparison. Reference is made to first extended defect 30. By virtue of skewing emitter array 50 to be mis-aligned with the xy-plane of the crystallographic axes in accordance with the teachings of the present invention, it is clearly shown that fewer adjacent emitters are impacted by first extended defect 30. Here, the orientation of the skew indicates that only one (or possibly two) emitters associated with device A would be designated as "failed" as a result of an interaction with first extended defect 30. The entire device A would not need to be defined as "failed", as was the case in the prior art configuration shown in FIG. 3.

Still referring to FIG. 4, second extended defect 32 is shown as extending across skewed emitter array 50 and impacting only a pair of individual emitters (one in device C and another in device D). Again, the use of a skewed emitter array in an arrangement where the emitter array is not aligned with the crystallographic xy-plane provides an improvement over the prior art.

It is clear that by virtue of skewing the emitter layout pattern to be misaligned with the xy-plane in accordance with this embodiment of the present invention, a fewer number of individual emitters are impacted by the presence of extended defects.

Figure 5:
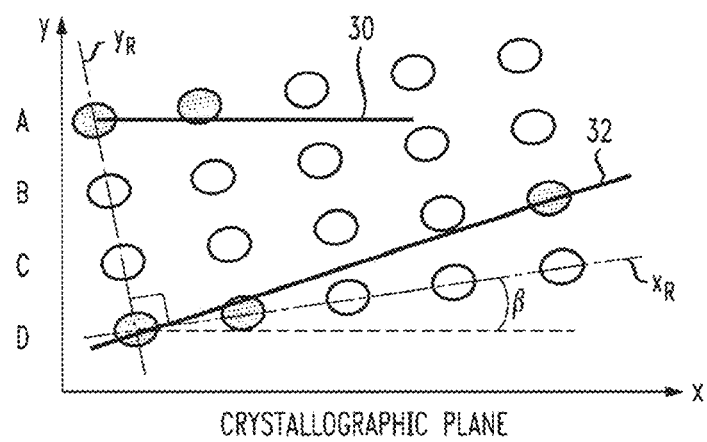
FIG. 5 illustrates an alternative emitter array layout pattern formed in accordance with the present invention, in this case where the emitter array layout is rotated with respect to the xy-plane, creating the desired mis-alignment between the, emitter array axes and the crystallographic axes of the semiconductor material.

Another embodiment of the present invention is illustrated in FIG. 5. In this case, an exemplary emitter array 60 is rotated with respect to xy-plane. Shown as dotted lines $x_R$ and $y_R$, these emitter array axes remain orthogonal, but the array itself is rotated through an angle β with respect to the xy-plane. Again, first extended defect 30 and second extended defect 32 are shown in this diagram, where the number of individual emitters impacted by either extended defect is reduced compared to the prior art arrangement shown in FIG. 3.

In accordance with the principles of the present invention, therefore, the statistical distribution of emitter failures per array is reduced by intentionally using an array pattern that is not aligned with the xy-plane of the crystallographic axes of the semiconductor material. Thus, the present invention, in its broadest conception, is based on the realization that the use of a mis-aligned emitter array layout pattern reduces the number of both individual emitters and devices that would be defined as "failures".

While these mis-aligned emitter layout patterns result in the likelihood that the total number of emitters impacted by a single extended defect is significantly reduced (when compared to the prior art regular grid layout), the "random" spacing of individual emitters with respect to the crystallographic xy-plane may result in a statistically higher probability that, at least one individual emitter will be located over a defect.

Figure 6:
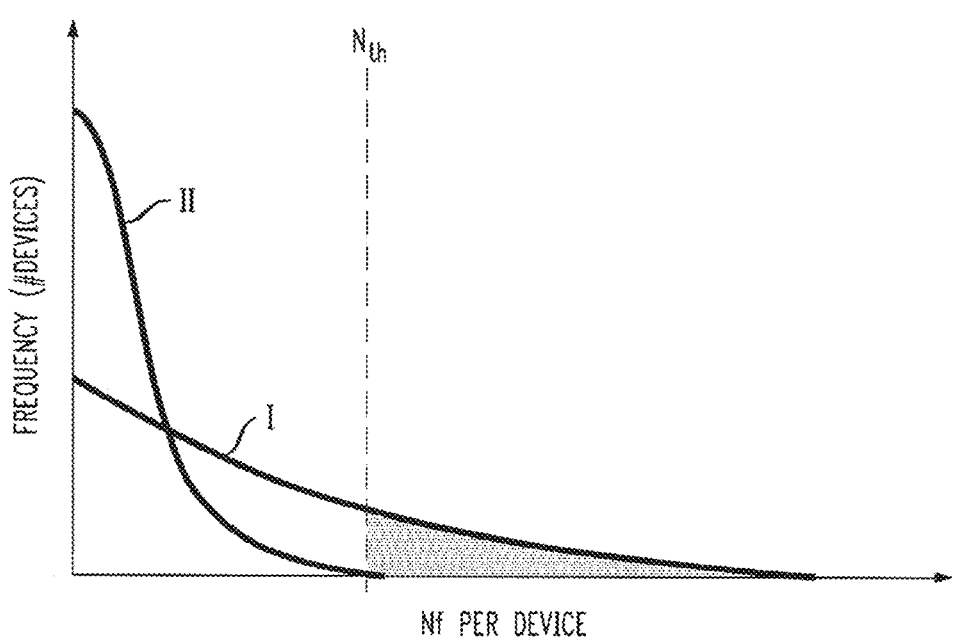
FIG. 6 is a qualitative histogram of the frequency (or number) of VCSEL devices (such as, for example, an array) with a given number of failed individual VCSEL diodes (referred to as "emitters").

FIG. 6 is a qualitative histogram illustrating this point, plotting the number of devices observed with a given number of failed emitters ($N_f$). Plot I is associated with the prior art "regular grid" emitter layout pattern of FIG. 3, and plot II is associated with the skewed emitter layout pattern of FIG. 4, Plot I shows that while only a few devices will have failed VCELs, a significant percentage of these devices will have a "large" number of individual failed emitters.

As mentioned above, a VCSEL device can be defined as "failed" if the total number of individual emitter failures in that device exceeds a certain threshold. FIG. 6 illustrates this threshold as $N_{th}$. As shown by the shaded region, there are a significant number of prior art devices that will be defined as "failed", based on this value of $N_{th}$. In contrast, plot II has a statistically insignificant number of arrays with a large number of emitter failures. Indeed, in the histogram of FIG. 6, plot II is shown as having a value of 0 (or close to 0) at the $N_{th}$ level.

It is to be understood that the skewed and rotated emitter layout patterns shown in FIGS. 4 and 5 are only two exemplary embodiments of emitter layout patterns that may be used in accordance with the present invention. In the larger sense, as long as the emitter layout pattern is other than aligned with the xy-plane of the crystallographic axes, the number of individual emitters impacted will be reduced.

The embodiments and examples set forth herein are presented to best explain the present invention and its practical applications and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive nor to limit the scope the of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A vertical cavity surface-emitting (VCSEL) array comprising
    a plurality of individual VCSEL devices formed within an epitaxially-grown structure of semiconductor material having a crystalline orientation and crystallographic axes represented as an xy-plane across a top surface of the epitaxially-grown structure of semiconductor material, the plurality of individual VCSEL devices formed in a uniformly-spaced two-dimensional array pattern that is skewed with respect to the crystallographic axes, thereby reducing the statistical probability of an individual VCSEL device intersecting an extended defect formed along a crystallographic axis of the semiconductor material.

2. The VCSEL array as defined in claim 1 wherein a skew pattern is defined by an $x_s$ axis not parallel to an x-axis of the xy-plane representation of the crystallographic axes, and a $y_s$ axis not parallel to a y-axis of the xy-plane representation of the crystallographic axes, and having an angle α less than 90° between the $x_s$ axis and the $y_s$ axis.

3. The VCSEL array as defined in claim 1 wherein a skew pattern is defined by an $x_s$ axis not parallel to an x-axis of the xy-plane representation of the crystallographic axes, and a $y_s$ axis not parallel to a y-axis of the xy-plane representation of the crystallographic axes, and having an angle α greater than 90° between the $x_s$ axis and the $y_s$ axis.

4. A VCSEL array as defined in claim 1 wherein the array is formed on a substrate of GaAs.

5. A VCSEL array as defined in claim 1 wherein the array is formed on a substrate of InP.

6. A VCSEL array comprising:
    a plurality of individual VCSEL diodes formed in a uniformly-spaced two-dimensional array pattern across a surface of a semiconductor material, wherein the two-dimensional array pattern is skewed with respect to the crystallographic axes of the semiconductor material, minimizing a number of VCSEL diodes affected by extended crystallographic defects in the semiconductor material structure.

* * * * *